US011188062B2

(12) United States Patent
Kobayashi et al.

(10) Patent No.: US 11,188,062 B2
(45) Date of Patent: Nov. 30, 2021

(54) WORK MANAGEMENT DEVICE

(71) Applicant: FUJI CORPORATION, Chiryu (JP)

(72) Inventors: Hitoshi Kobayashi, Okazaki (JP); Junichi Kako, Nagoya (JP); Shinichi Naka, Nagoya (JP); Yusuke Kikuchi, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/483,296

(22) PCT Filed: Feb. 6, 2017

(86) PCT No.: PCT/JP2017/004177
§ 371 (c)(1),
(2) Date: Aug. 2, 2019

(87) PCT Pub. No.: WO2018/142604
PCT Pub. Date: Aug. 9, 2018

(65) Prior Publication Data
US 2020/0012264 A1    Jan. 9, 2020

(51) Int. Cl.
*G05B 19/418* (2006.01)
*H05K 13/08* (2006.01)

(52) U.S. Cl.
CPC ... *G05B 19/41875* (2013.01); *H05K 13/0882* (2018.08); *G05B 2219/31001* (2013.01);
(Continued)

(58) Field of Classification Search
CPC .... G05B 19/41875; G05B 2219/31001; G05B 2219/34379; G05B 2219/37192;
(Continued)

(56) References Cited

U.S. PATENT DOCUMENTS

| 5,434,790 A * | 7/1995 | Saka | G06Q 10/06 |
| | | | 700/110 |
| 6,338,148 B1 * | 1/2002 | Gillenwater | G06F 11/2273 |
| | | | 714/25 |

(Continued)

FOREIGN PATENT DOCUMENTS

| JP | 2004-5602 A | 1/2004 |
| JP | 2007-328677 A | 12/2007 |

(Continued)

OTHER PUBLICATIONS

International Search Report dated May 16, 2017 in PCT/JP2017/004177 filed on Feb. 6, 2017.

*Primary Examiner* — Charles R Kasenge
(74) *Attorney, Agent, or Firm* — Oblon, McClelland, Maier & Neustadt, L.L.P.

(57) ABSTRACT

A work management device manages a board work line having multiple board work machines for performing work on a board. The work management device includes a problem detection section configured to detect that a problem has occurred in any of the multiple board work machines; a handling method database configured to accumulate handling methods for problems; an updating section configured to update handling methods for problems at any time; and a work instruction section configured to extract and indicate to an operator a handling method for a problem from the handling method database when the problem detection section detects that the problem has occurred.

8 Claims, 8 Drawing Sheets

(52) U.S. Cl.
CPC .............. *G05B 2219/34379* (2013.01); *G05B 2219/37192* (2013.01)

(58) Field of Classification Search
CPC .. G05B 19/418; H05K 13/0882; H05K 13/00; Y02P 90/02; Y02P 90/04
See application file for complete search history.

(56) References Cited

U.S. PATENT DOCUMENTS

| | | | | |
|---|---|---|---|---|
| 6,557,115 B2* | 4/2003 | Gillenwater | ........ | G06F 11/2273 714/18 |
| 7,035,774 B2* | 4/2006 | Fujiwara | ................. | H04L 67/36 340/504 |
| 7,142,939 B2* | 11/2006 | Nonaka | ............ | G05B 19/41805 700/121 |
| 7,440,812 B2* | 10/2008 | Yano | ................ | G05B 19/41805 700/108 |
| 7,536,236 B2* | 5/2009 | Yano | ................ | G05B 19/41805 700/121 |
| 7,885,718 B2* | 2/2011 | Yano | ................ | G05B 19/41805 700/65 |
| 7,890,204 B2* | 2/2011 | Maenishi | ............. | H05K 13/085 700/121 |
| 8,086,338 B2* | 12/2011 | Yano | ...................... | G06Q 10/10 700/108 |
| 8,560,474 B2* | 10/2013 | Wang | .................. | G06F 11/2257 706/21 |
| 10,571,897 B2* | 2/2020 | Iisaka | ................ | G05B 19/4184 |
| 2002/0053045 A1* | 5/2002 | Gillenwater | ........ | G06F 11/2273 714/38.14 |
| 2003/0098798 A1* | 5/2003 | Kato | .................. | G05B 23/0272 340/679 |
| 2003/0139176 A1* | 7/2003 | Fujiwara | ................. | H04L 67/36 455/420 |
| 2004/0153868 A1* | 8/2004 | Nonaka | .................. | G06Q 10/10 714/47.2 |
| 2006/0129352 A1* | 6/2006 | Fujiwara | ............... | H04L 67/125 702/182 |
| 2006/0136786 A1* | 6/2006 | Nonaka | ............. | H05K 13/0465 714/39 |
| 2006/0136787 A1* | 6/2006 | Yano | .................. | H05K 13/0465 714/39 |
| 2006/0287843 A1* | 12/2006 | Matsushita | ...... | G05B 19/41875 702/185 |
| 2007/0288306 A1 | 12/2007 | Ohishi et al. | | |
| 2009/0043413 A1* | 2/2009 | Yano | .................. | H05K 13/0882 700/95 |
| 2009/0204251 A1* | 8/2009 | Maenishi | ............. | H05K 13/085 700/117 |
| 2009/0259333 A1* | 10/2009 | Yano | ...................... | G06Q 10/10 700/121 |
| 2012/0136692 A1 | 5/2012 | Ohishi et al. | | |
| 2012/0233104 A1* | 9/2012 | Wang | .................. | G06N 3/0427 706/21 |
| 2014/0058698 A1* | 2/2014 | Gu | .................. | G01R 31/31705 702/117 |
| 2018/0217583 A1* | 8/2018 | Samara | ............ | G05B 19/41855 |
| 2019/0004501 A1* | 1/2019 | Iisaka | ............... | G05B 19/41875 |

FOREIGN PATENT DOCUMENTS

| | | |
|---|---|---|
| JP | 2015-108886 A | 6/2015 |
| WO | WO 2005/009101 A1 | 1/2005 |
| WO | WO 2014/049871 A1 | 4/2014 |
| WO | WO 2016/088266 A1 | 6/2016 |

\* cited by examiner

| ERROR CODE | INFORMATION ACQUIRED | HANDLING METHOD | HANDLING PERFORMANCE |
|---|---|---|---|
| BOARD CONVEYANCE ERROR | DEVICE INFORMATION AT TIME OF ERROR OCCURRENCE | METHOD A | — |
| | | METHOD B | — |

FIG. 5B

| ERROR CODE | INFORMATION ACQUIRED | HANDLING METHOD | HANDLING PERFORMANCE |
|---|---|---|---|
| BOARD CONVEYANCE ERROR | · DEVICE INFORMATION AT TIME OF ERROR OCCURRENCE<br>· MAINTENANCE INFORMATION<br>· PREDICTIVE INFORMATION | METHOD A | — |
| | | METHOD B | — |

FIG. 5C

| ERROR CODE | INFORMATION ACQUIRED | HANDLING METHOD | HANDLING PERFORMANCE |
|---|---|---|---|
| BOARD CONVEYANCE ERROR | · DEVICE INFORMATION AT TIME OF ERROR OCCURRENCE<br>· MAINTENANCE INFORMATION<br>· PREDICTIVE INFORMATION | METHOD A | +1 |
| | | METHOD B | — |

FIG. 5D

| ERROR CODE | INFORMATION ACQUIRED | HANDLING METHOD | HANDLING PERFORMANCE |
|---|---|---|---|
| BOARD CONVEYANCE ERROR | · DEVICE INFORMATION AT TIME OF ERROR OCCURRENCE<br>· MAINTENANCE INFORMATION<br>· PREDICTIVE INFORMATION | METHOD A | — |
| | | METHOD B | +1 |

| ERROR CODE | INFORMATION ACQUIRED | HANDLING METHOD | HANDLING PERFOR-MANCE |
|---|---|---|---|
| HEAD ERROR | · DEVICE INFORMATION AT TIME OF ERROR OCCURRENCE<br>· MAINTENANCE INFORMATION<br>· PREDICTIVE INFORMATION | METHOD P | +1 |
| | | METHOD Q | − |
| | | METHOD R | − |

FIG. 8

| ERROR CODE | INFORMATION ACQUIRED | HANDLING METHOD | HANDLING PERFOR-MANCE |
|---|---|---|---|
| COMPONENT DATA ERROR | · DEVICE INFORMATION AT TIME OF ERROR OCCURRENCE<br>· CORRECTION HISTORY INFORMATION OF COMPONENT DATA | CHANGE OF NOZZLE SIZE | +1 |
| | | CHANGE OF OPERATIONAL SPEED | — |
| | | CHANGE OF ALLOWABLE EXTERNAL DIMENSIONS | — |

WORK MANAGEMENT DEVICE

TECHNICAL FIELD

This specification discloses a work management device.

BACKGROUND ART

Conventionally, there has been known a work management device for managing a board work line having multiple board work machines for performing work on a board. For example, the work management device described in Patent Literature 1 decides on an operator who performs support work when support work needs to be performed on a board work machine and notifies a portable terminal of the operator who was decided on for the support work. In the work management device described in Patent Literature 2, when an operator detection section detects an operator positioned in the vicinity of a location where an operator detection section is installed, the operator is instructed to perform a work item that can be performed by the operator. Examples of work items that can be performed by the operator are the work items having a difficulty level equal to or less than the difficulty level ranked to the operator.

PATENT LITERATURE

Patent Literature 1: WO2005/009101A1
Patent Literature 2: WO2016/088266A1

BRIEF SUMMARY

Technical Problem

However, in the conventional work management device, when a problem occurs in the board work machine, it is not possible to automatically instruct the operator with an appropriate handling method. Therefore, the operator has to handle the problem by trial and error, and it sometimes takes a long time to resolve the problem.

The present disclosure has been made in order to resolve the above-mentioned problem, and it is a main object of the present disclosure to enable an operator to appropriately handle a problem in a short time when the problem occurs in a board work machine.

Solution to Problem

The work management device of the present disclosure is a work management device for managing a board work line having multiple board work machines for performing work on a board, the work management device comprising: a problem detection section configured to detect that a problem has occurred in any of the multiple board work machines; a handling method database configured to accumulate handling methods for problems; an updating section configured to update handling methods for problems at any time; and a work instruction section configured to extract and indicate to the operator a handling method for a problem from the handling method database and instruct an operator when the problem detection section detects that the problem has occurred.

In this work management device, when a problem occurs in any one of the multiple board work machines, the work instruction section extracts and indicates to the operator a handling method for the problem from the handling method database. The handling method database is updated by the updating section as needed. Therefore, when a new handling method for the problem is found, the handling method is also stored in the handling method database. Thus, when a problem occurs in the board work machine, it is likely to happen that the operator can adequately handle the problem in a short time by executing the handling method indicated by the work instruction section.

DESCRIPTION OF EMBODIMENTS

Figure 1:
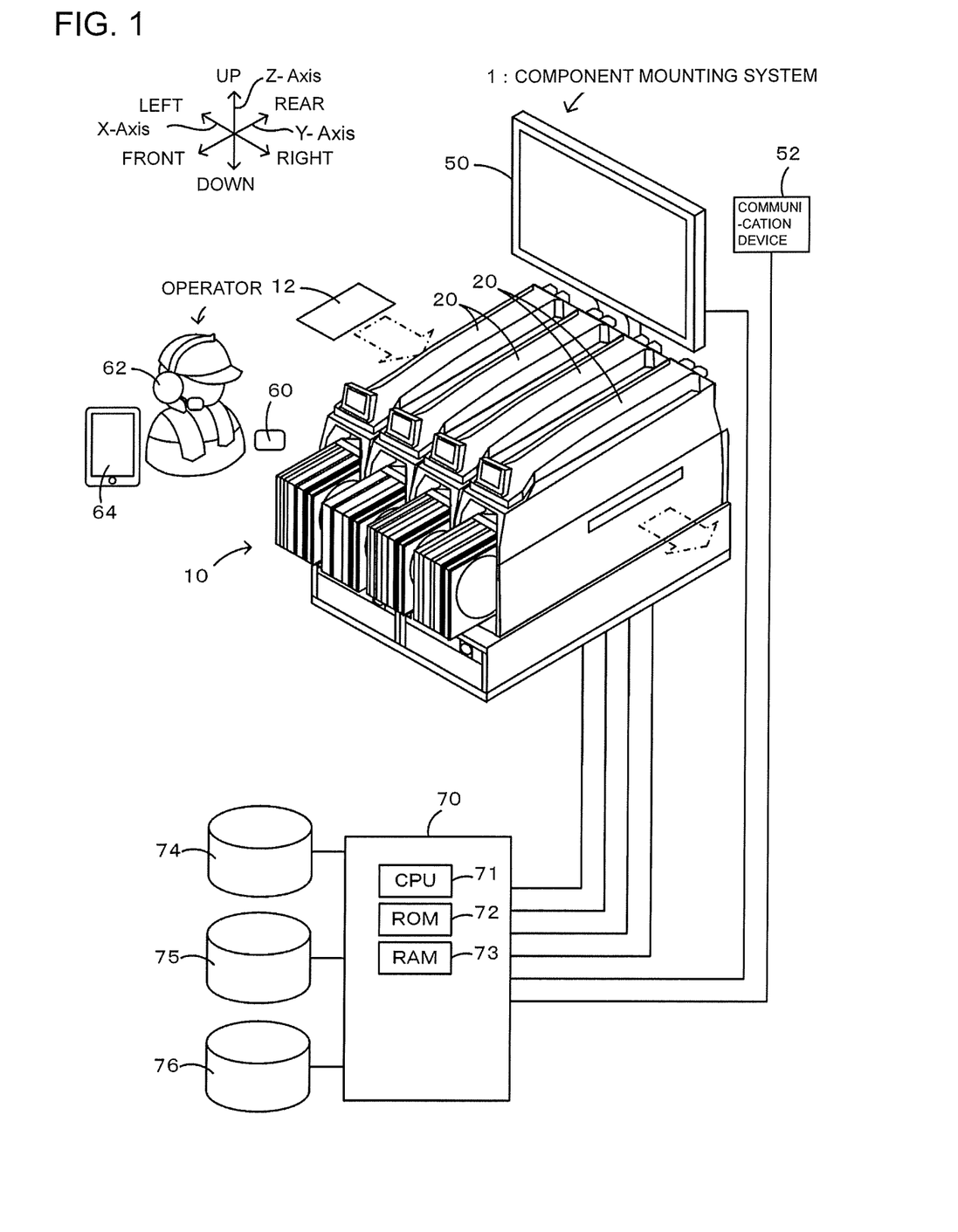
FIG. 1 Schematic view of component mounting system 1.
Figure 2:
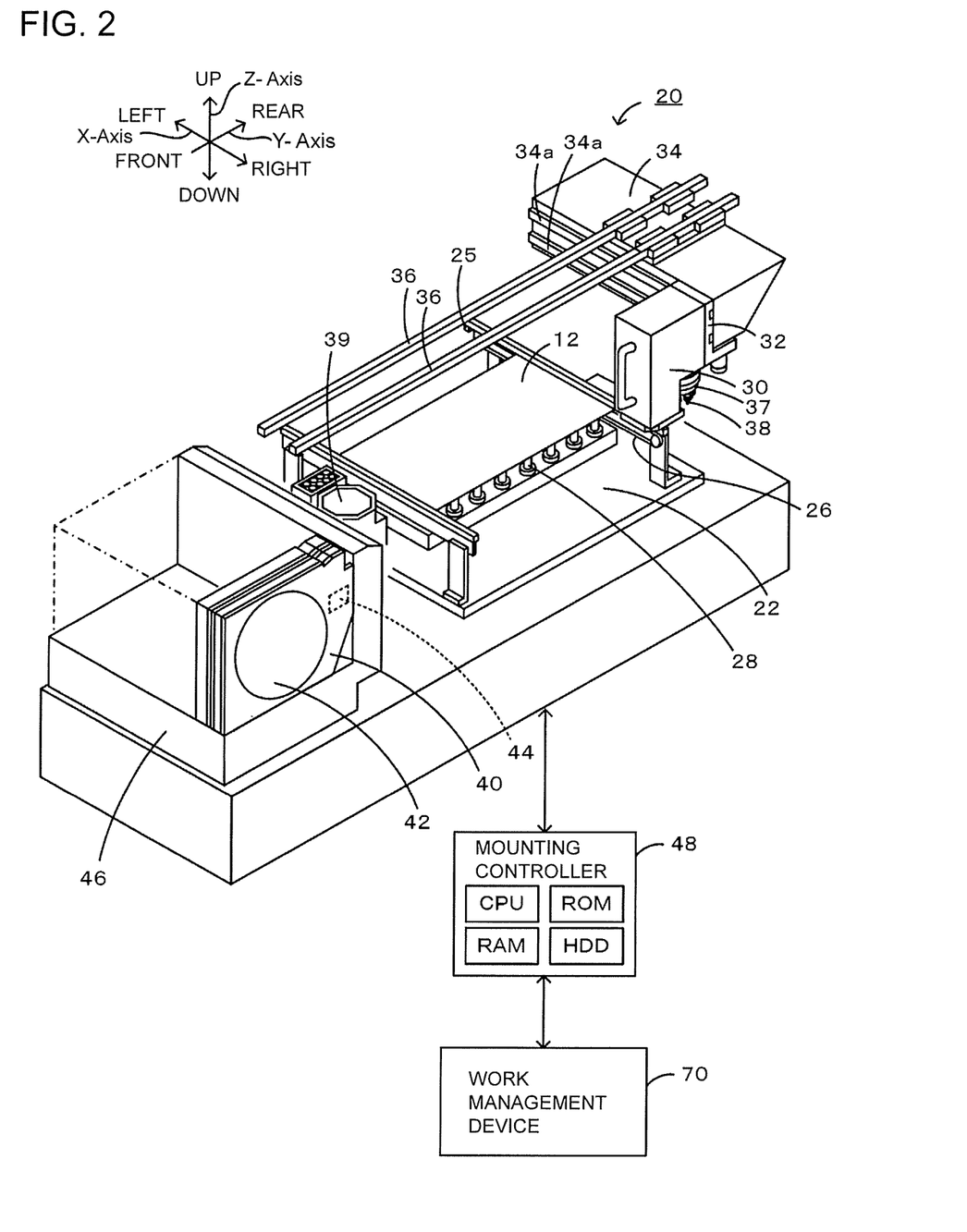
FIG. 2 Perspective view of component mounting machine 20.

Preferred embodiments including the work management device of the present disclosure are described below with reference to the drawings. FIG. 1 is a schematic view of component mounting system 1, and FIG. 2 is a perspective view of component mounting machine 20. In the present embodiment, the left-right direction (X-axis), the front-rear direction (Y-axis), and the up-down direction (Z-axis) are as shown in FIGS. 1 and 2.

As shown in FIG. 1, component mounting system 1 includes mounting line 10, multiple component mounting machines 20 forming mounting line 10, large-size display device 50 mounted on mounting line 10, communication device 52 mounted on mounting line 10, and work management device 70 for managing work on board 12.

In mounting line 10, multiple (in this case, four) component mounting machines 20 are arranged in the left-right direction, and each component mounting machine 20 mounts a component on board 12 conveyed in from the upstream side (left side), and conveys out the board 12, after the component is mounted, to the downstream side (right side).

As shown in FIG. 2, component mounting machine 20 includes board conveyance device 22, head unit 30, parts camera 39, feeders 40, and mounting controller 48.

Board conveyance device 22 includes a pair of conveyor belts 26, 26 (only one of which is shown in FIG. 2) which are provided with a space therebetween in the front-rear direction and extend in the left-right direction. Board 12 is conveyed from left to right on the upper surfaces of the pair of conveyor belts 26, 26. When board 12 reaches a predetermined uptake position, it is supported from the backside by multiple support pins 28 placed upright. Board conveyance device 22 is provided with passage sensor 25 at a predetermined position through which board 12 passes. Passage sensor 25 outputs an off signal when board 12 is not detected and outputs an on signal when the board 12 is detected.

Head unit 30 is detachably attached to the front face of X-axis slider 32. X-axis slider 32 is slidably attached to a pair of upper and lower guide rails 34a, 34a extending in the left-right direction and provided on the front face of Y-axis slider 34. Y-axis slider 34 is slidably attached to a pair of left and right guide rails 36, 36 extending in the front-rear direction. Head unit 30 moves in the left-right direction as X-axis slider 32 moves in the left-right direction and moves in the front-rear direction as Y-axis slider 34 moves in the front-rear direction. Each of sliders 32, 34 is driven by a drive motor, not shown. Head unit 30 includes head (rotary head) 37 having multiple nozzles 38. Nozzle 38 uses pressure to pick up components to the nozzle tip or separate components picked up by the nozzle tip. The height of nozzle 38 can be adjusted by a Z-axis ball screw mechanism (not shown) mounted on head unit 30. Head 37 and nozzle 38 are suitably exchanged according to the type and size of the components.

Parts camera 39 is installed between feeder setting base 46 and board conveyance device 22 so that the imaging direction is directed upward at the approximate center of the length in the left-right direction. Parts camera 39 images a component picked up by nozzle 38 passing thereabove and outputs an image obtained by the imaging to mounting controller 48.

Feeders 40 are set arranged in multiple rows in the left-right direction on a feeder setting base 46 attached to the front of component mounting machine 20. Each feeder 40 has reel 42 on which tape is wound. The surface of the tape has multiple accommodating recesses along the longitudinal direction of the tape. The accommodating recesses accommodate components. The components are protected by a film covering the surface of the tape. The tape is unwound backward from reel 42 and the film is peeled off at a predetermined component supply position to expose the components. The exposed component is picked up by nozzle 38. The operation of feeder 40 is controlled by feeder controller 44.

Mounting controller 48 is configured as a microprocessor with a CPU as a centerpiece, and includes ROM for storing a process program, an HDD for storing various data, RAM used as a work area, and the like. These are electrically connected via a bus (not shown). Mounting controller 48 is connected to feeder controller 44 of feeder 40 and work management device 70 so as to be capable of bidirectional communication. Mounting controller 48 is connected to board conveyance device 22, X-axis slider 32, Y-axis slider 34, the Z-axis ball screw mechanism, and the like so as to be able to output a control signal to those devices, and is also connected to parts camera 39 so as to be capable of receiving images from parts camera 39.

As shown in FIG. 1, large-size display device 50 is, for example, a 100-inch liquid crystal display and is connected to work management device 70. Large-size display device 50 displays various types of information transmitted from work management device 70.

As shown in FIG. 1, communication device 52 is a device capable of communicating with wireless tag 60 existing in a communication area (for example, within a range of several meters to several tens of meters) by Bluetooth® or the like. Wireless tag 60 is attached to an operator. When communication device 52 communicates with wireless tag 60 present in the communication zone, it acquires an operator ID from wireless tag 60 and transmits the operator ID to work management device 70. In addition to wireless tag 60, the operator is equipped with headset 62, in which a headphone and a microphone are integrated, and portable terminal 64, which comes with a display screen. Headset 62 and portable terminal 64 are wirelessly connected to work management device 70. In addition to mounting line 10, communication device 52 is also disposed in places where the operator passes through (such as a rest room).

As shown in FIG. 1, work management device 70 is configured as a microprocessor with CPU 71 as a centerpiece and includes ROM 72 for storing process programs, RAM 73 used as a work area, and the like. These are electrically connected via a bus (not shown). Work management device 70 is connected to production information database 74, operator information database 75, and know-how database 76 in an accessible manner. Production information database 74 stores a production program of board 12, the production progress, and the like, and is updated as needed. Operator information database 75 stores the operator ID and operator information (i.e., the operator's position, the work for the operator in charge, the operator's skills, the operator's work state, and the operator's work schedule) in association with each other, and is updated as needed. Know-how database 76 stores handling methods for problems occurring in component mounting machine 20 of mounting line 10, and is updated as needed. Work management device 70 performs bi-directional communication with communication device 52 provided in mounting controller 48 of each component mounting machine 20, mounting line 10, and the like. Work management device 70 outputs an image signal to the display screen of large-size display device 50 or the portable terminal 64 of the operator, and outputs an audio signal to the headphones of the headset 62 of the operator.

Next, the operation of each component mounting machine 20 constituting mounting line 10 will be described. Mounting controller 48 of component mounting machine 20 controls board conveyance device 22, X-axis slider 32, Y-axis slider 34, Z-axis ball screw mechanism, parts camera 39, and the like based on the production program received from work management device 70. More specifically, mounting controller 48 causes nozzle 38 to pick up the components supplied by feeders 40, causes parts camera 39 to image the components, determines the presence or absence of a component error based on the captured images, and then causes the components picked up by nozzle 38 to be sequentially mounted on board 12. Here, the presence or absence of a component error is determined based on whether a component is picked up by nozzle 38, and whether the shape, size, pickup position, and the like of the component are appropriate. Mounting controller 48 causes the component picked up by nozzle 38 to be mounted on board 12 when it is determined that there is no component error, but if it is determined that there is a component error, the component is released and the same component is picked up again (i.e., reattempted). Mounting controller 48 reattempts picking up the component even when a component is not picked by nozzle 38 due to a pickup error or a drop.

Figure 3:
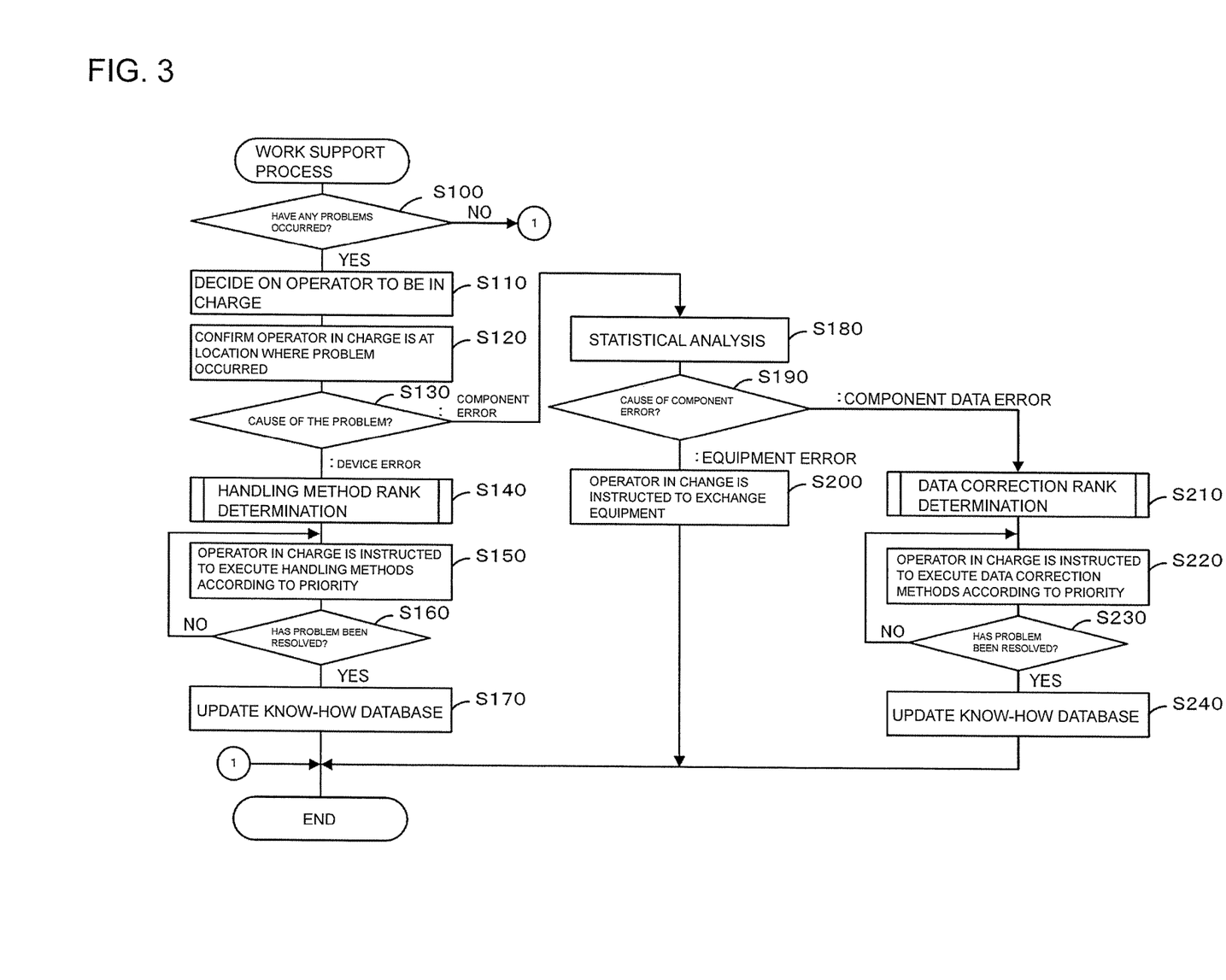
FIG. 3 Flowchart of a work support process.

Next, a work support process executed by work management device 70 will be described. FIG. 3 is a flowchart of the work support process. When the work support process is started, CPU 71 of work management device 70 first determines whether any problems have occurred in mounting line 10 (S100). If it is determined that no problems have occurred in S100, CPU 71 ends the operation support process. Here, problems include the production of mounting line 10 stopping or the production operation of mounting line 10 being remarkably decreased. For example, when a device error (e.g., a board conveyance error) occurs in component mounting machine 20, mounting controller 48 stops production and transmits an error code indicating that a device error has occurred to work management device 70. The error code is set so that the device of component mounting machine 20 in which the error occurred in can be determined. Further, when reattempts at picking up of a component occurs continually in component mounting machine 20, mounting controller 48 stops production and transmits an error code, indicating that a component error has occurred, to work management device 70. Therefore, CPU 71 determines that a problem has occurred when receiving an error code from component mounting machine 20. Further, CPU 71 of operation management device 70 calculates the cycle time required for component mounting per board, as needed, in mounting line 10, and when the cycle time exceeds a predetermined threshold, determines that the production operation is remarkably lowered due to a component error, and determines that a problem has occurred. For example, even in a case where reattempts at picking up a component do not occur continually but the frequency of occurrence is high, the cycle time will exceed the threshold value.

If it is determined that a problem has occurred in S100, CPU 71 decides on an operator (i.e., an operator in charge) to be in charge of handling the problem that has occurred this time based on operator information stored in operator information database 75 (S110). CPU 71 searches operator information database 75 for an operator who can work at present based on the work conditions, work schedules, and the like, and decides on an operator to be in charge of handling the problem that has occurred this time. CPU 71 recognizes the position of the operator in charge based on the communication result between wireless tag 60 of the operator in charge and communication device 52, and displays a moving instruction on the display device of portable terminal 64 of the operator in charge when the operator in charge is located away from mounting line 10 in which the problem has occurred. At the same time, CPU 71 outputs a voiced moving instruction to the headphones of headset 62 of the operator in charge. CPU 71 also displays a moving instruction on large-size display device 50 in the vicinity of the operator in charge. Consequently, the operator in charge moves to mounting line 10 in which the problem has occurred.

Next, CPU 71 confirms the operator in charge is at mounting line 10 where the problem occurred (S120). More specifically, CPU 71 confirms that the operator in charge is present in mounting line 10, in which the problem occurred, based on the communication result between wireless tag 60 of the operator in charge and communication device 52 deployed in mounting line 10 in which the problem occurred.

CPU 71 then determines whether the cause of the problem was a device error or a component error (S130). Specifically, CPU 71 determines whether the cause of the problem was a component error or a device error based on information used in the determination of S100.

Figure 4:
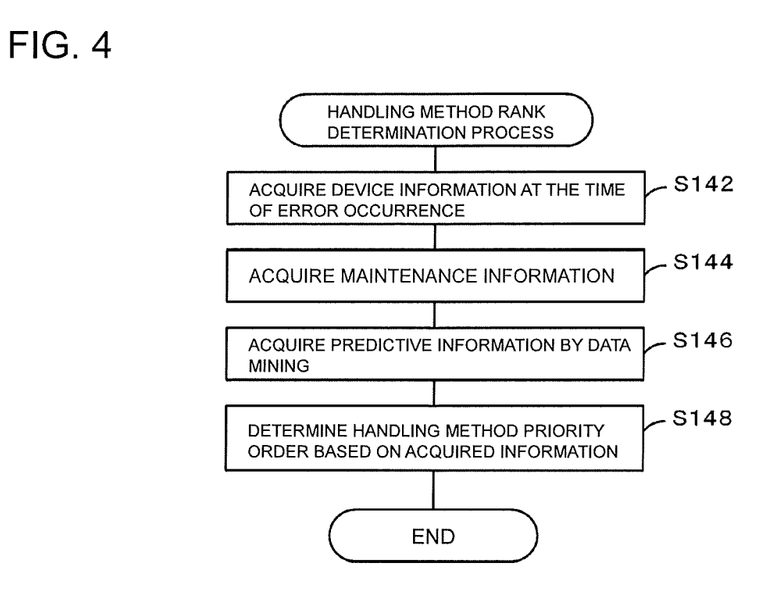
FIG. 4 Flowchart of a handling method rank determination process.

If the cause of the S130 problem is a device error, CPU 71 executes a handling method rank determination process (S140). A flowchart of the handling method rank determination process is shown in FIG. 4. When starting the handling method rank determination process, CPU 71 first acquires device information at the time of the error occurrence (S142), acquires maintenance information of the device (S144), and acquires predictive information by data mining (S146). Device information at the time of error occurrence is information indicating what state the device was in at the time of occurrence of the error. Device information includes, for example, information indicating whether the output signal of a certain sensor was on or off at the time of error occurrence. Examples of maintenance information include past maintenance results and next maintenance timing information. From the maintenance information, it is predicted that a component should be exchanged when maintenance of a certain component is frequently performed, the component should be exchanged when the time for exchanging of a certain component is approaching, and the maintenance should be performed ahead of time when the time for maintenance for a certain component is approaching. As predictive information from data mining, information obtained by time-series analysis of information from various sensors until the occurrence of the present error can be cited. For example, as predictive information, the chronological flow of output signals of various sensors from the logs of the various sensors until the occurrence of the present error may be used, or the chronological order of other errors that have occurred until the occurrence of the present error may be used. Then, based on device information at the time of error occurrence, maintenance information, and predictive information from data mining, CPU 71 extracts a handling method for the current device error from know-how database 76, and determines the priorities thereof (S148). When handling performance is assigned to the handling methods, the higher the method's performance, the higher CPU 71 sets the priority.

Figure 5A:
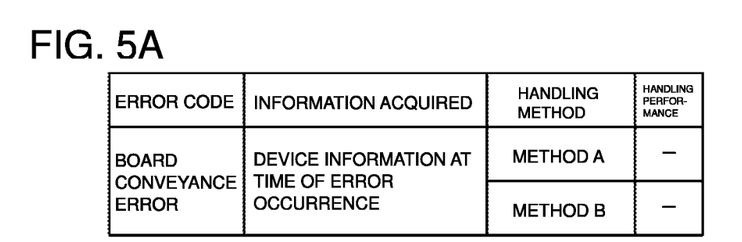
FIG. 5 Diagram showing an example of data stored in know-how database 76.
Figure 5B:
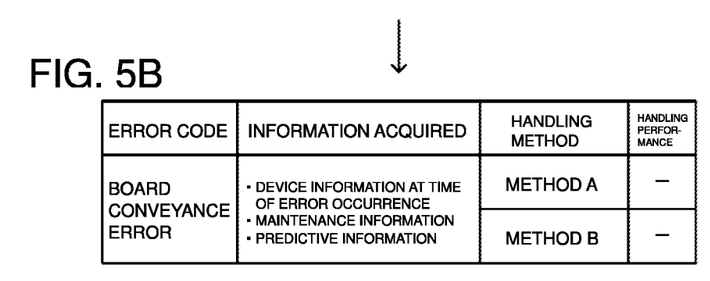

For example, when the device error is a board conveyance error, the device information of board conveyance device 22 is acquired and the state of board conveyance device 22 at the time of error occurrence is determined. Here, a case will be described, as an example, in which the output of passage sensor 25 does not change to the OFF signal even if a predetermined time elapses after the output of passage sensor 25 changes to the ON signal (i.e., picking up of board 12 is not completed). Possible causes include loosening and breakage of conveyor belts 26, 26, and a failure in setting the sensitivity of passage sensor 25. If the cause is loosening or breakage of conveyor belts 26, 26, re-tightening or replacing the conveyor belts 26, 26 (method A) can be cited as a handling method. If failure of setting the sensitivity of passage sensor 25 is the cause, sensitivity adjustment (method B) of passage sensor 25 can be cited as a handling method. Example data stored in know-how database 76 at this time is shown in FIG. 5A. The data in FIG. 5A is in an initial state, and with the error code being a board conveyance error and the mounting information at the time of error occurrence is that of the output of passing sensor 25 remaining on, methods A and B are associated as handling methods. This time, assume that the maintenance information indicates that the time for replacing conveyor belts 26, 26 is near, and assume that the predictive information, with consideration how the chronological checking of the on/off status of passage sensor 25 changed until the time of error occurrence, indicates the switching in a state of being regularly performed on a periodic basis. CPU 71 writes the maintenance information and the indication information in the field of the acquired information and updates the data of FIG. 5B with the data from FIG. 5A. In addition, CPU 71 determines from the maintenance information that it is highly probable that the cause is the loosening or damage of conveyor belts 26, 26 and, as a handling method, the order of priority of method A is higher than that of method B. In FIG. 5A, 5B, the handling performances are assumed to be "none" (default values) for both methods A, B.

After executing the handling method rank determination process (S140), CPU 71 displays the handling methods for this problem according to priority on large-size display device 50 provided in mounting line 10 (S150). Specifically, the operator in charge is instructed to implement the first handling method in the priority order among the handling methods for this problem. The operator in charge performs work according to the displayed instructions and restarts production in mounting line 10 when the work is completed. Subsequently, CPU 71 determines whether the problem has been resolved (S160). More specifically, CPU 71 determines whether the same problem has occurred during the period from the time when production is resumed until a predetermined period of time has elapsed. If the same problem does not occur in S160, CPU 71 deems that the problem has been resolved, updates know-how database 76 (S170), and ends the operation support process. In S170, CPU 71 incrementally increases the handling performance of the handling method implemented for this problem by 1.

On the other hand, if the same problem occurs in S160, that is, the problem has not yet been resolved, CPU 71 returns to S150 and displays the handling methods for the present problem, in order of priority, on large-size display device 50 provided in mounting line 10. Specifically, the operator in charge is instructed to implement the second priority handling method among the handling methods for dealing with this problem. The operator in charge performs work according to the displayed instructions and restarts production in mounting line 10 when the work is completed. Next, CPU 71 determines whether the issue has been resolved (S160). CPU 71 repeatedly executes S150 and S160 until the problem is resolved by S160, and when the problem is resolved, CPU 71 executes S170 and ends the operation support process. When S150 and S160 are repeatedly executed, CPU 71 instructs the operator in charge to execute a handling method in which the priority is one level lower than the previous priority in S150.

Figure 5C:
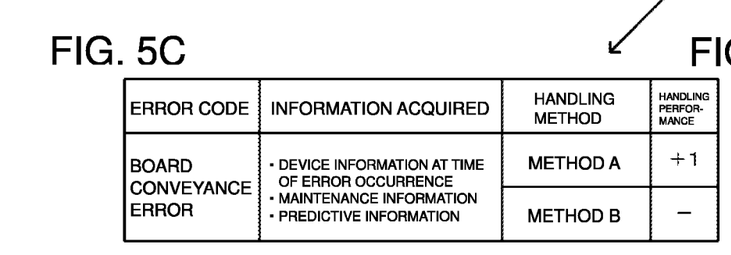
Figure 5D:
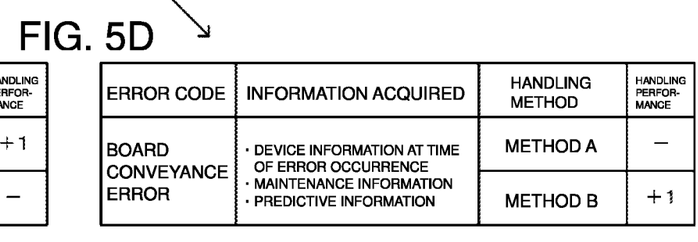

For example, as described above, when the time for replacing conveyor belts 26, 26 is approaching, based on past maintenance results, the priority order of method A is set higher than method B. If this happens, CPU 71 will display "Re-tighten or exchange the conveyor belts" (method A) on large-size display device 50. Following this instruction, the operator in charge re-tightens conveyor belts 26, 26. After that, if the problem is resolved, CPU 71 increments the handling performance of method A, which is a handling method for the current board conveyance error, by 1 (see FIG. 5C). Therefore, when the same error occurs next time (i.e., a device error being aboard conveyance error, the mounting information at the time of error occurrence indicating the output of passage sensor 25 being remained as an ON signal, the maintenance information indicating the time for replacing conveyor belts 26, 26 coming soon, and the predictive information indicating passage sensor 25 being regularly switched on and off on a periodic basis), CPU 71 instructs the operator in charge to preferentially execute the high-performance method A. On the other hand, if the same errors occur immediately after restarting production, CPU 71 displays "Adjust the sensitivity of the passage sensor" (method B) on large-size display device 50. Following this instruction, the operator in charge adjusts the sensitivity of passage sensor 25. After that, if the problem is resolved, CPU 71 increments the handling performance of method B, which is a handling method for the current board conveyance error, by 1 (see FIG. 5D). Therefore, when the same error occurs next time, CPU 71 instructs the operator in charge to preferentially execute high-performance method B.

If the cause of the S130 problem is a component error, CPU 71 performs a statistical analysis (S180) and determines whether the cause of the component error is an error in the equipment related to component pickup or a component data error (step S190). Errors in the equipment related to component pickup include cases where head 37 is malfunctioning, cases where nozzle 38 is malfunctioning, cases where feeder 40 is malfunctioning, and the like. When head 37 malfunctions, the pickup rate of all components of component mounting machine 20 on which the malfunctioning head is mounted decreases. When nozzle 38 malfunctions, the pickup rate of all components picked up by the malfunctioning nozzle decreases. When feeder 40 malfunctions, the pickup rate of components in all reels 42 mounted on the malfunctioning feeder decreases. Further, in the case of a component data error, the pickup rate of components of the same component type decreases regardless of the equipment related to the component pickup. Therefore, by statistically analyzing the events that have occurred, it is possible to determine whether the cause of the component error was an error of the equipment related to component pickup or a component data error.

Figure 6:
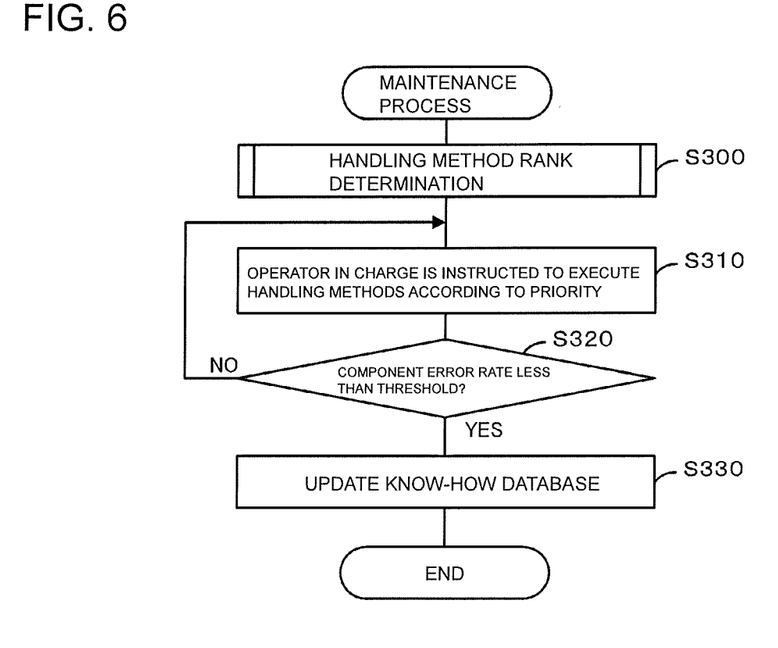
FIG. 6 Maintenance process flowchart.
Figure 7:
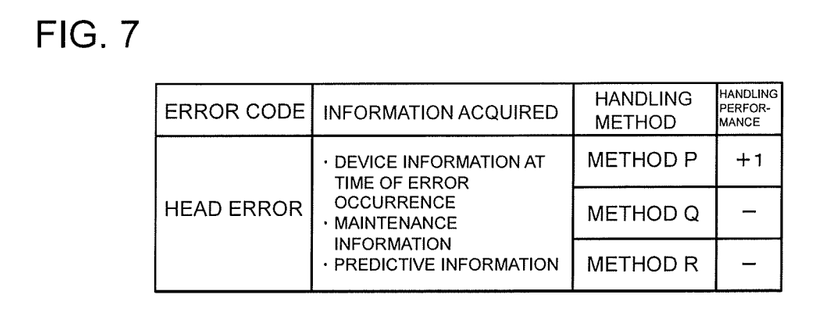
FIG. 7 Diagram showing an example of data stored in know-how database 76.

If the cause of the component error in S190 is an error in equipment related to the component pickup, CPU 71 instructs the operator in charge to exchange the equipment with other equipment (i.e., normally functioning equipment) and continue production (S200). Instructions to the operator in charge are given by outputting characters to large-size display device 50. After confirming that the equipment has been exchanged, CPU 71 terminates the operation support process. The removed equipment is moved to a maintenance area (not shown), and maintenance is performed. FIG. 6 is a flowchart of the maintenance process executed by CPU 71. When starting the maintenance process, CPU 71 first executes a handling method rank determination process (S300). This handling method rank determination process is the same as the handling method rank determination process in S140 described above and therefore explanation thereof is omitted. As a result, the priority of the handling method (i.e., maintenance methods) for the removed equipment is determined. Examples of handling methods include greasing (method P), component cleaning (method Q), and component exchanging (method R). CPU 71 instructs the operator in charge with the handling method according to the order of priorities (S310). The operator in charge performs work according to the displayed instructions and restarts production in mounting line 10. CPU 71 monitors the component error rate (i.e., the component error count/component pickup count) of component mounting machine 20, determines whether the component error rate after operating for a predetermined time is less than a predetermined threshold (S320), and if the component error rate is equal to or greater than the predetermined threshold, returns to S310 and instructs the operator in charge to remove the equipment and execute the second-priority handling method (i.e., maintenance method). CPU 71 repeats this process until the component error rate falls below a predetermined threshold. Then, if the component error rate falls below the predetermined threshold value, CPU 71 increments the handling performance of the handling method at that time by 1, updates know-how database 76 (S330), and terminates the maintenance process. This point is the same as S170 described above. An example of data of know-how database 76 at this time is shown in FIG. 7.

Returning to the flowchart of FIG. 3, if the cause of the component error is a component data error in S190, CPU 71 performs a data correction rank determination process (S210). In the data correction rank determination process, device information at the time of error occurrence (e.g., information such as there being no component present in the captured image of parts camera 39 or that a component is present but discarded) and correction history information of the component data are acquired, and the priority order of the data correction methods is determined based on this information. In the component data, in addition to shape information such as the external dimensions of the components and their allowable ranges, handling conditions (nozzle size, horizontal operational speed, vertical operational speed, etc.) for handling with component mounting machine 20 are defined. For example, if the nozzle size is too small, as a result of not being able to pick up a component with nozzle 38 or a component drops from nozzle 38 while being conveyed, the component does not appear in the captured image. In this case, the problem may be resolved by resetting the nozzle size to be large. If the allowable range of the external dimension is too small, the component size is determined to be incompatible and is discarded, but the component appears in the captured image. In this case, the problem may be resolved by increasing the allowable range of the external dimensions. Therefore, CPU 71 can determine the priority order of the correction methods for the component data based on the device information at the time of error occurrence. Further, since CPU 71 can recognize the correction method executed immediately before based on the correction history information of the component data, the priority level of the correction method is lowered. This is because the component error was not resolved even though the correction method was already implemented.

Figure 8:
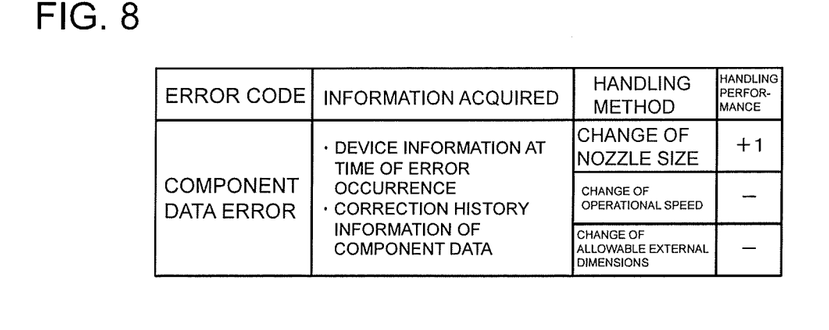
FIG. 8 Diagram showing an example of data stored in know-how database 76.

CPU 71 then instructs the operator in charge with data correction methods according to priority (S220). Then, after the operator in charge executes the data correction method and component mounting is restarted, CPU 71 determines whether the problem has been resolved (S230) and repeats processes of S220 and S230 until the problem is resolved. When the problem has been resolved, CPU 71 updates know-how database 76 by increasing the handling performance by 1 for the data correction method actually implemented for the present problem (S240) and ends the operation support process. An example of data of know-how database 76 at this time is shown in FIG. 8.

Here, the correspondence relationship between the constituent elements of work management device 70 of the present embodiment and the constituent elements of the work management device of the present disclosure will be described. CPU 71 of the present embodiment corresponds to a problem detection section, an updating section, and a work instruction section, and know-how database 76 corresponds to a handling method database.

In work management device 70 of the present embodiment described in detail above, when a problem occurs in any of multiple component mounting machines 20, CPU 71 extracts and indicates to the operator a handling method for the problem from know-how database 76. Know-how database 76 is updated by CPU 71 as needed. Therefore, when a new handling method for the problem is found, the handling method is also stored in know-how database 76. Therefore, when a problem occurs in component mounting machine 20, there is a high probability that the operator can properly handle the problem in a short time by executing the handling method indicated by work management device 70.

Further, since the operator attempts the handling methods in order from the higher priority, the probability of solving the problem in a short time increases.

Furthermore, since the handling method that actually resolved the problem has a higher handling performance, and higher priority is given to handling methods with higher performance, the probability is high that a problem will be resolved when a handling method having a high priority is implemented.

Furthermore, when the cause of the problem is a device error, work management device 70 extracts a handling method from know-how database 76 based on device information at the time of error occurrence, maintenance information, and predictive information by data mining. Thus, it is possible to extract a handling method for a device error more properly from know-how database 76. Here, maintenance information includes past maintenance performance information and next maintenance timing information of the device provided in component mounting machine 20. Predictive information includes chronological information on the device provided in component mounting machine 20 before the occurrence of the present device error. Therefore, the reliability of the extracted handling method increases.

When the cause of the problem is component data, work management device 70 extracts a handling method from know-how database 76 based on device information at the time of error occurrence and correction history information of the component data. Thus, it is possible to extract a handling method for a component error more properly from know-how database 76.

The present disclosure is not limited in any way to the above-mentioned embodiments, and it is needless to say that the present disclosure can be implemented in various forms as long as they fall within the technical scope of the present disclosure.

For example, in the embodiment described above, a case in which one work management device 70 updates know-how database 76 has been exemplified, but update results (i.e., the accumulation of new handling methods and updates to the handling performance of existing handling methods) from other work management devices 70 may be integrated and reflected in know-how database 76. In this case, since the update results of multiple work management devices 70 are integrated and reflected in know-how database 76, the reliability of the handling method is enhanced.

In the embodiment described above, component mounting machine 20 is described as example of a board work machine, but the present disclosure is not particularly limited to component mounting machine 20. For example, a solder printing machine that prints cream solder on a board, a printing inspection machine that inspects the quality of solder printing, and the like can be cited as a board work machine disposed upstream from component mounting machine 20. Examples of board work machines disposed downstream from component mounting machine 20 include an appearance inspection machine for inspecting the appearance of a board on which components are mounted, and a reflow machine for melting and soldering solder of a board on which components are mounted.

In the embodiment described above, an example was described in which the operator carries portable terminal 64, but an eyeglass-type display, using the lens of the eyeglasses as a display, may be equipped instead of portable terminal 64. While portable terminal 64 needs to be removed from a pocket or a bag, an eyeglass-type display does not require as such and is therefore more convenient.

In the embodiment described above, CPU 71 extracts the handling method based on the device information, the maintenance information, and the predictive information at the time of error occurrence in the handling method rank determination process, however, the handling method may be extracted based on one of these three pieces of information, or the handling method may be extracted based on two pieces of information (e.g., the mounting information and the maintenance information at the time of error occurrence, the mounting information at the time of error occurrence, or the predictive information at the time of error occurrence).

The work management device of the present disclosure may be configured as follows.

In the work management device of the present disclosure, when the problem detection section detects that a problem has occurred, among the handling methods for handling the problem, the work instruction section may give higher priority to the handling method having a higher probability of solving the problem and then indicate that handling method to the operator. Thus, the operator attempts the handling methods in order from the higher priority, thereby increasing the probability of solving the problem in a short time.

In this case, when the problem is resolved after the handling method is indicated to the operator by the work instruction section, the updating section may update the handling method database so as to increase the handling performance of the handling method, from the handling method database, which resolved the problem, and the work instruction section may increase the priority level as the handling performance is higher. In this case, the handling method that actually resolved the problem has a higher handling performance, and the higher the handling performance is, the higher the priority is. Therefore, there is a higher probability that the problem can be resolved when a high-priority handling method is implemented.

In the work management device of the present disclosure, the updating section may integrate update results from other work management devices and reflect the integrated update results in the handling method database. In this case, since the results of multiple work management devices are reflected in the handling method database, the reliability of the handling method is enhanced.

In the work management device of the present disclosure, when the cause of the problem is a device provided in the board work machine, the work instruction section may receive, from the board work machine, at least one of device information, maintenance information, and predictive information by data mining of the board work machine, those being acquired when a problem occurs; and the work instruction section may extract and indicate to the operator a handling method for the problem from the handling method database based on the information received from the component mounting machine. In this way, it is possible to more properly extract a handling method for the problem when the cause of the problem is a device provided in the board work machine from the handling method database.

Maintenance information may include past maintenance performance information and next maintenance timing information of a device provided in the board work machine. Since the handling method is extracted in consideration of such maintenance information, the reliability of the handling method is enhanced. For example, when there is a device that has been frequently maintained in the past, it may be better to exchange the device with a new one because the product life of the device is approaching. In addition, if there is equipment that is approaching the next maintenance timing, it may be better to perform the maintenance of the equipment ahead of time.

Predictive information by data mining may include chronological information on a device provided in the board work machine before the problem occurred. Since the handling method is extracted in consideration of such predictive information, the reliability of the handling method is enhanced. For example, the chronological flow of output signals from various devices until the present problem occurred may be used as predictive information, or the chronological order of other problems that have occurred before the present problem occurred may be used as predictive information.

In the work management device of the present disclosure, when the cause of the problem is component data, the work instruction section may receive at least one of device information of the board work machine when the problem occurred and correction history information for the component data from the board work machine, and the work instruction section may extract and indicate to the operator a handling method for the problem from the handling method database based on the information received from the component mounting machine. By doing so, it is possible to more properly extract a handling method from the handling method database for the problem when the cause of the problem is component data.

INDUSTRIAL APPLICABILITY

The present disclosure can be used to manage a board work machine that performs work on a board.

REFERENCE SIGNS LIST

1 Component mounting system, 10 Mounting line, 12 Board, 20 Component mounting machine, 22 Board conveyance device, 25 Passage sensor, 26 Conveyor belt, 28 Support pin, 30 Head unit, 32 X-axis slider, 34 Y-axis slider, 34a Guide rail, 36 Guide rail, 37 Head, 38 Nozzle, 39 Parts camera, 40 Feeder, 42 Reel, 44 Feeder controller, 46 Feeder set, 48 Mounting controller, 50 Large-size display device, 52 Communication device, 60 Wireless tag, 62 Headset, 64 Portable terminal, 70 Work management device, 71 CPU, 72 ROM, 73 RAM, 74 Production information database, 75 Operator information database, 76 Know-how database.

The invention claimed is:

1. A work management device for managing a board work line having multiple board work machines for performing work on a board, the work management device comprising:
   circuitry configured to detect that a problem has occurred in any of the multiple board work machines;
   a handling method database configured to accumulate handling methods for problems in a handling method database;
   update handling methods for problems as needed;
   identify an operator to handle the problem;
   extract a handling method for a problem from the handling method database when the problem has occurred; and
   indicate to the operator, via a mobile terminal of the operator, the handling method when the problem has occurred,
   wherein, when the problem is resolved after the handling method is indicated to the operator, the circuitry updates the handling method database to increase a handling performance of the handling method, from the handling method database, which resolved the problem; and
   wherein the circuitry increases a priority level of the handling method as the handling performance increases.

2. The work management device of claim 1, wherein, when the circuitry detects that a problem has occurred, the circuitry gives higher priority to handling methods having a higher probability of solving the problem and instructs the operator.

3. The work management device of claim 1, wherein the circuitry integrates an update result from another work management device and reflects the integrated update result in the handling method database.

4. The work management device of claim 1, wherein, when the cause of the problem is a device provided in the board work machine, the circuitry receives, from the board work machine, at least one of device information, maintenance information, and predictive information by data mining of the board work machine when a problem occurs; and the circuitry extracts and indicates to the operator a handling method for the problem from the handling method database based on the information received from the board work machine.

5. The work management device of claim 4, wherein the maintenance information includes past maintenance performance information and next maintenance timing information of a device provided in the board work machine.

6. The work management device of claim 4, wherein the predictive information by data mining includes chronological information on a device in the board work machine before the problem occurred.

7. The work management device of claim 4, wherein, when the cause of the problem is component data, the circuitry receives at least one of device information of the board work machine when the problem occurred and correction history information for the component data from the board work machine; and the circuitry extracts and indicates to the operator a handling method for the problem from the handling method database based on the information received from the component mounting machine.

8. The work management device of claim 1, wherein the circuitry is configured to identify the operator based on at least a work schedule.

* * * * *